United States Patent
Pezzini

[11] Patent Number: 5,579,196
[45] Date of Patent: Nov. 26, 1996

[54] PROTECTION CIRCUIT FOR DEVICES COMPRISING NONVOLATILE MEMORIES

[75] Inventor: Saverio Pezzini, Vimercate, Italy

[73] Assignee: SGS-Thomson Microelectronics S.r.l., Agrate Brianza, Italy

[21] Appl. No.: 267,145

[22] Filed: Jun. 27, 1994

[30] Foreign Application Priority Data

Jun. 28, 1993 [EP] European Pat. Off. .............. 93830279

[51] Int. Cl.$^6$ ..................................... H02H 3/18
[52] U.S. Cl. ................................. 361/86; 361/90
[58] Field of Search .................................. 361/86, 92, 90, 361/218, 226, 227; 365/226, 189.07, 218, 227; 371/3; 307/130

[56] References Cited

U.S. PATENT DOCUMENTS

| | | | |
|---|---|---|---|
| 4,975,878 | 12/1990 | Boddu et al. | 365/189.07 |
| 4,975,883 | 12/1990 | Baker et al. | 365/226 |
| 5,199,032 | 3/1993 | Sparks et al. | 371/3 |
| 5,371,709 | 12/1994 | Fisher et al. | 365/226 |

FOREIGN PATENT DOCUMENTS 0053273  6/1982  European Pat. Off. .
0454170  10/1991  European Pat. Off. .

OTHER PUBLICATIONS

European Search Report No. EP 93 83 0279 and Annex to the European Search Report Nov. 25, 1993.

Primary Examiner—Jeffrey A. Gaffin
Assistant Examiner—Stephen W. Jackson
Attorney, Agent, or Firm—David V. Carlson; Seed and Berry LLP

[57] ABSTRACT

A protection circuit (1) comprising a first and second supply line at a first and second supply voltage respectively; a reference voltage source; a comparator connected to the first supply line and the source; and a switch controlled by the comparator via a control terminal and located between the second supply line and the output of the circuit. To reduce static consumption of the comparator under normal operating conditions, the circuit comprises enabling control elements connected to the two supply lines and to the comparator for disabling the comparator and turning on the switch when the two supply voltages differ by a value below a predetermined threshold, but are greater than a reference value.

21 Claims, 1 Drawing Sheet

5,579,196

1

PROTECTION CIRCUIT FOR DEVICES COMPRISING NONVOLATILE MEMORIES

TECHNICAL FIELD

The present invention relates to a protection circuit for devices comprising nonvolatile memories.

BACKGROUND OF THE INVENTION

In devices comprising nonvolatile memories, such as EPROMs, EEPROMs and flash-EEPROMs, the content of the memory must be protected in the event supply $V_{CC}$ is inadvertently cut off in the presence of programming voltage $V_{PP}$, or in the event voltage $V_{PP}$ is applied before supply voltage $V_{CC}$ when the device is turned on.

For this purpose, protection circuits are provided comprising comparators, which compare supply voltage $V_{CC}$ with a reference voltage and, if the supply voltage is lower than the reference voltage, disable supply of voltage $V_{PP}$ to prevent damaging the memory or altering the stored data.

A drawback of known circuits of the aforementioned type is the high static consumption of the comparators employed.

SUMMARY OF THE INVENTION

It is an object of the present invention to provide a protection circuit which protects the integrity of data stored in nonvolatile memories while providing for low power consumption.

DETAILED DESCRIPTION OF THE INVENTION

Figure 1:
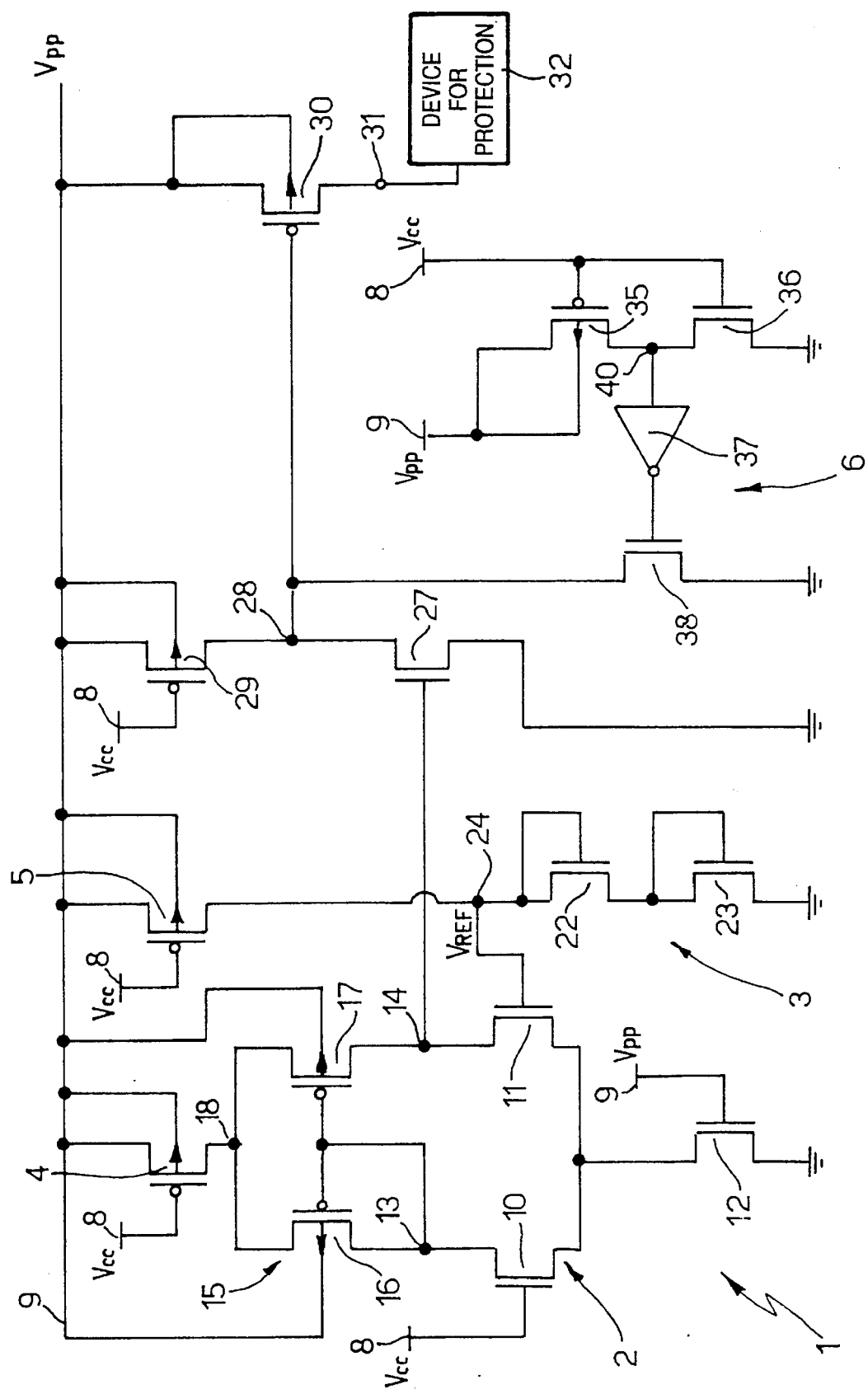
FIG. 1 is a circuit diagram of the preferred embodiment of the present invention.

According to the present invention, there is provided a protection circuit for devices comprising nonvolatile memories, as claimed in claim 1.

A preferred, non-limiting embodiment of the present invention will be described by way of example with reference to FIG. 1, which shows a simplified electric diagram of the circuit according to the present invention.

The circuit according to the present invention, indicated as a whole by 1 in FIG. 1, receives voltages $V_{CC}$ (the supply voltage) and $V_{PP}$ (the programming voltage of the memory) supplied respectively over lines 8 and 9. The circuit substantially comprises a comparator 2, a reference voltage $V_{REF}$ source 3 (both supplied with voltage $V_{PP}$ via respective P channel MOS transistors 4, 5), and an inverter 6 supplied with voltage $V_{PP}$ and controlled by supply voltage $V_{CC}$.

More specifically, comparator 2 comprises a pair of N channel MOS transistors 10, 11 having the control terminals connected respectively to $V_{CC}$ supply line 8 and voltage source 3; the source terminals of the pair of N channel MOS transistors connected to each other and to a constant current source 12 (in this case, a MOS transistor); and the drain terminals connected (at nodes 13, 14) to the inputs of a current mirror 15 formed by two P channel MOS transistors 16, 17. Transistor 16 connected to transistor 10 of comparator 2 is diode-connected, with its control terminal shortcircuited with its drain terminal connected to node 13. The source terminals of transistors 16 and 17 are mutually connected at node 18, which is connected via transistor 4 to

2 line 9 supplying voltage $V_{PP}$. The drain terminals of transistors 16 and 17 are connected to nodes 13 and 14, respectively. Transistor 4 has its control terminal connected to line 8 ($V_{CC}$), the drain terminal connected to node 18, and the source terminal and substrate connected to line 9. The drawing also shows the connection between the substrate of transistors 16, 17 and line 9 ($V_{PP}$).

In the embodiment shown, voltage source 3 is formed by the series connection of two diode-connected N channel MOS transistors 22 and 23 connected between node 24, to which the control terminal of transistor 11 is connected, and ground (also defined as reference potential line). Node 24 is also connected to line 9 via transistor 5, which has its control terminal connected to voltage $V_{CC}$, the drain terminal connected to node 24, and the source terminal and substrate connected to line 9.

The output node 14 of comparator 2 is connected to the control terminal of an N channel MOS output transistor 27 having the source terminal grounded and the drain terminal connected, via node 28, to the drain terminal of a P channel MOS transistor 29, which has its control terminal connected to $V_{CC}$ line 8, and the source terminal and substrate connected to $V_{PP}$ line 9. Transistors 27 and 29 combine to form an inverter.

Node 28 is connected to the output of inverter 6 and to the control terminal of a P channel MOS transistor 30 operating as a switch. More specifically, transistor 30 has its source terminal and substrate connected to line 9, and its drain terminal (defining output 31 of circuit 1) connected to the device 32 for protection (including a memory not shown).

Inverter 6 comprises a pair of opposite-channel transistors 35, 36 series connected to each other; an inverter 37; and an N channel MOS transistor 38 operating as a switch. More specifically, transistor 35 is of P channel type, with the source terminal and substrate connected to line 9; the drain terminal connected to the drain terminal of transistor 36 at node 40; and the control terminal connected to the control terminal of transistor 36 and to $V_{CC}$ line 8. Transistor 36, which is of N channel type, has its source terminal grounded. Inverter 37 is located between node 40 and the control terminal of transistor 38. Transistor 38 has its source terminal grounded and its drain terminal connected to node 28.

Operation of the above circuit will now be described with reference to three possible states of supply lines 8 and 9. In the following description, the threshold voltage of the PMOS transistors (the voltage between the source terminal and control terminal, over and above which the transistor is turned on) is indicated by $V_{TH}$.

The first possible state of supply lines 8 and 9 is defined by the following relationships:

$$V_{CC}<V_{REF} \text{ and } V_{CC}<V_{PP}-V_{TH} \text{ (i.e. } V_{PP}-V_{CC}>V_{TH})$$

This situation is typically encountered when, for any reason, the supply voltage (but not the programming voltage) is cut off, or, when the device is turned on, the programming voltage increases more rapidly than the supply voltage, in which case, supply of the programming voltage must be prevented.

In the above situation, transistor 35 is on; transistor 36 is off; node 40 is high; the output of inverter 37 is low, so that transistor 38 is off; transistors 4, 5 and 29, supply comparator 2, and voltage source 3 are on; and, since the control terminal of transistor 10 is at a lower potential ($V_{CC}$) than node 24 ($V_{REF}$), output 14 of comparator 2 is low, transistor 27 is off, node 28 presents roughly the same potential as line 9 ($V_{PP}$), and transistor 30 is off, thus disabling supply of $V_{PP}$.

The second possible state of supply lines 8 and 9 is defined by the following relationships:

$$V_{CC} > V_{REF} \text{ and } V_{CC} > V_{PP} - V_{TH} \text{ (i.e. } V_{PP} - V_{CC} < V_{TH})$$

This is the normal operating situation encountered for more frequently than the others (e.g., when reading the memory of device 32) and in which static consumption of comparator 2 is undesirable.

In the above situation, transistor 35 is off; transistor 36 is on; node 40 is low; the output of inverter 37 is high; transistor 38 is on, thus grounding node 28; transistor 30 is on, thus enabling supply of $V_{PP}$; and transistors 4, 5 and 29 are off so that comparator 2 is also off and absorbs no current. The state of transistor 27 is unknown.

The third possible state of supply lines 8 and 9 is defined by the following relationships:

$$V_{REF} < V_{CC} < V_{PP} - V_{TH} \text{ (i.e. } V_{PP} - V_{CC} > V_{TH})$$

This is a special condition used, for example, when programming the memory, and wherein the supply voltage is higher than the reference voltage, but the programming voltage is much higher than the supply voltage.

In the above condition, transistor 35 is on; node 40 is high; the output of inverter 37 is low, so that transistor 38 is off; transistors 4, 5 and 29, supply voltage source 3 and comparator 2 are on; since the control terminal of transistor 10 is at a higher potential ($V_{CC}$) than node 24 ($V_{REF}$), output 14 of comparator 2 is high; transistor 27 is on and maintains a low voltage at node 28; and transistor 30 is on, thus enabling supply of programming voltage $V_{PP}$ to output 31 of the circuit and to device 32.

As this is a special operating condition lasting only a small portion of the overall operating time of the memory, consumption by comparator 2 is acceptable.

When both $V_{CC}$ and $V_{PP}$ are low, transistor 30 can be either on or off depending on the specific properties of the transistors selected when designing the circuit of FIG. 1. As a low $V_{PP}$ value, however, in no way endangers device 32, the state of circuit 1 is of little importance.

The advantages of the circuit according to the present invention will be clear from the foregoing description. Firstly, it provides for detecting situations endangering the device and due to the supply voltage being cut off in the presence of programming voltage, or due to the programming voltage rising more rapidly as compared with the supply voltage when the device is turned on. Secondly, under normal operating conditions, static consumption of the comparator is zero, thus eliminating any consumption and associated dissipation problems. In any case, the circuit according to the present invention provides for correct supply of the programming voltage as determined by the operating conditions.

Finally, the solution described is straightforward in design, provides for troublefree implementation and integration, and presents a high degree of reliability in any situation.

Those skilled in the art will appreciate that changes may be made to the circuit described and illustrated herein without, however, departing from the scope of the present invention. In particular, implementation of the components may differ as compared with that described, e.g., instead of being MOS types, the transistors may consist of bipolar devices.

I claim:

1. A protection circuit for devices comprising nonvolatile memories, the circuit comprising:

at least a first and a second supply line at a first and second supply voltage respectively;

reference voltage source means;

comparing means connected to said first supply line and to said source means;

switch means controlled by said comparing means via a control terminal and located between said second supply line and the output of said circuit; and enabling control means connected to said first and second supply lines and to said comparing means for disabling said comparing means and turning on said switch means when said first and second supply voltages differ by a value below a predetermined threshold.

2. A circuit as claimed in claim 1 wherein said source means are connected to said second supply line via a controlled switch located between said second supply line and said source means and having a control terminal connected to said first supply line.

3. A circuit as claimed in claim 1 wherein said comparing means comprise a differential circuit having an output terminal connected to a control terminal of an output transistor connected between said second supply line, via a controlled switch, and a reference potential line.

4. A circuit as claimed in claim 1 wherein said enabling control means comprise a differential inverter stage having a first and second input connected respectively to said first and said second supply line, and an output connected to said control terminal of said switch means.

5. A circuit as claimed in claim 4 wherein said inverter stage comprises:

first and second transistors having respective first terminals connected to a same node, respective second terminals connected respectively to said second supply line and to a reference potential line, and respective control terminals connected to each other and to said first supply line;

an inverter element having an input connected to said node, and an output; and a third transistor having a first terminal connected to said control terminal of said switch means, and a control terminal connected to said output of said inverter element.

6. A circuit as claimed in claim 5 wherein said first transistor is a P channel MOS transistor and said second and third transistors are N channel MOS transistors.

7. A circuit as claimed in claim 1 wherein said enabling control means comprise a first controlled switch located between said second supply line and said comparing means and having a control terminal connected to said first supply line.

8. A circuit as claimed in claim 7 wherein said source means are connected to said second supply line via a second controlled switch located between said second supply line and said source means and having a control terminal connected to said first supply line.

9. A circuit as claimed in claim 8 wherein said comparing means comprise a differential circuit having an output terminal connected to a control terminal of an output transistor connected between said second supply line, via a third controlled switch, and a reference potential line.

10. A circuit as claimed in claim 9 wherein each of said first, second and third controlled switches comprises a P channel MOS transistor, and said output transistor comprises an N channel MOS transistor.

11. A circuit as claimed in claim 9 wherein said enabling control means comprise a differential inverter stage having a first and second input connected respectively to said first and said second supply line, and an output connected to said control terminal of said switch means.

12. A circuit as claimed in claim 11 wherein said inverter stage comprises;

first and second transistors having respective first terminals connected to a same node, respective second terminals connected respectively to said second supply line and to a reference potential line, and respective control terminals connected to each other and to said first supply line;

an inverter element having an input connected to said node, and an output; and a third transistor having a first terminal connected to said control terminal of said switch means, and a control terminal connected to said output of said inverter element.

13. A circuit as claimed in claim 12 wherein said first transistor is a P channel MOS transistor and said second and third transistors are N channel MOS transistors.

14. A circuit for protecting a device which comprises nonvolatile memories, the circuit protecting the device by decoupling a programming voltage to the device, the circuit comprising:

a voltage reference source;

a comparator having a first control input coupled to a supply voltage, a second control input coupled to the voltage reference source, and an output;

a protection transistor having a control terminal coupled to the output of the comparator, the protection transistor selectively coupling the programming voltage to the device; and a disabling component coupled to the programming voltage and to the comparator, the disabling component disabling the comparator if the difference between the programming voltage and the supply voltage is less than a predefined threshold voltage to prevent the output of the comparator from altering the state of the protection transistor while the comparator is disabled.

15. The circuit of claim 14 wherein the disabling component is a transistor having a first terminal for selectively rendering the transistor conductive, a second terminal and a third terminal, the first terminal being coupled to the supply voltage, the second terminal being coupled to the programming voltage, mad the third terminal being coupled to the comparator.

16. The circuit of claim 14, further comprising:

an enabling transistor having a first terminal for selectively rendering the enabling transistor conductive, a second terminal, and a third terminal, the first terminal being connected to the supply voltage, the second terminal being connected to the programming voltage, and the third terminal being connected to the control terminal of the protection transistor; and an output transistor having a first terminal for selectively rendering the output transistor conductive, a second terminal, and a third terminal, the first terminal being connected to the output of the comparator, the second terminal being connected to the third terminal of the protection transistor and the third terminal being connected to a reference potential.

17. The circuit of claim 14, further comprising:

a circuit stage having a first input connected to the programming voltage, a second input connected to the supply voltage and an output connected to the control terminal of the protection transistor, the output of the circuit stage placing the protection transistor in a state which decouples the programming voltage from the device if the difference between the programming voltage and the supply voltage is less than the predefined threshold voltage.

18. A circuit for protecting a device which includes at least one memory, the circuit comprising:

a first supply voltage and a second supply voltage;

a protection switch for selectively providing the first supply voltage to the device;

a comparator being coupled to the second supply voltage, the second supply voltage providing operational power to the comparator, the comparator having an output which is coupled to the protection switch; and a disabling switch coupled to the comparator, the disabling switch disconnecting the comparator from the first supply voltage when a difference between the first supply voltage and the second supply voltage is less than a predefined value, the disabling switch disconnecting the comparator from the first supply voltage to save power and to render the comparator inoperative.

19. A method for protecting a device that includes at least one nonvolatile memory, the method comprising the steps of:

providing a first operative voltage;

providing a second operative voltage;

providing a reference voltage;

comparing the first operative voltage to the reference voltage;

comparing the first operative voltage to the second operative voltage; and preventing said step of comparing the first operative voltage to the reference voltage when a difference between the first and second operative voltages is less than a predetermined value.

20. The method of claim 19, further comprising the steps of:

disabling a supply of the second voltage to the device when the first operative voltage is less than the reference voltage and a difference between the first and second operative voltages is less than a predetermined value;

enabling a supply of the second voltage to the device when the first operative voltage is greater than the reference voltage and the difference between the first and second operative voltages is less than the predetermined value; and enabling a supply of the second voltage to the device when the first operative voltage is greater than the reference voltage and the difference between the first and second operative voltages is greater than the predetermined value.

21. The method of claim 19 wherein said preventing step comprises the step of disconnecting a comparator from the first operative voltage.

* * * * *